United States Patent
Hughes et al.

(10) Patent No.: US 7,262,724 B2
(45) Date of Patent: Aug. 28, 2007

(54) SYSTEM AND METHOD FOR ADJUSTING DYNAMIC RANGE OF ANALOG-TO-DIGITAL CONVERTER

(75) Inventors: James David Hughes, Boynton Beach, FL (US); Mahibur Rahman, Lake Worth, FL (US); Louis J. Vannatta, Crystal Lake, IL (US)

(73) Assignees: Freescale Semiconductor, Inc., Austin, TX (US); Motorola, Inc., Schaumburg, IL (US)

(*) Notice: Subject to any disclaimer, the term of this patent is extended or adjusted under 35 U.S.C. 154(b) by 0 days.

(21) Appl. No.: 11/095,910

(22) Filed: Mar. 31, 2005

(65) Prior Publication Data

US 2006/0220935 A1    Oct. 5, 2006

(51) Int. Cl.
*H03M 1/00* (2006.01)
(52) U.S. Cl. .............. 341/139; 341/118; 341/120; 341/155; 341/159; 455/67.11; 455/226.1
(58) Field of Classification Search ............. 341/118, 341/120, 139, 155, 158–159; 455/115.1
See application file for complete search history.

(56) References Cited

U.S. PATENT DOCUMENTS

| | | | |
|---|---|---|---|
| 4,417,233 A | 11/1983 | Inoue et al. | |
| 5,389,927 A * | 2/1995 | Turney et al. | 341/139 |
| 6,002,356 A * | 12/1999 | Cooper | 341/160 |
| 6,081,219 A * | 6/2000 | Prasanna | 341/159 |
| 6,373,423 B1 | 4/2002 | Knudsen | |
| 6,504,863 B1 * | 1/2003 | Hellmark | 375/219 |
| 6,567,025 B2 * | 5/2003 | Schreier et al. | 341/143 |
| 6,603,416 B2 * | 8/2003 | Masenas et al. | 341/120 |
| 6,668,027 B1 * | 12/2003 | Scarpa | 375/345 |
| 6,670,901 B2 * | 12/2003 | Brueske et al. | 341/139 |
| 6,686,863 B1 | 2/2004 | Jaussi et al. | |
| 6,993,291 B2 * | 1/2006 | Parssinen et al. | 341/139 |
| 2003/0078007 A1 * | 4/2003 | Parssinen et al. | 455/67.1 |
| 2004/0080439 A1 * | 4/2004 | Van Der Mee | 341/139 |
| 2004/0233091 A1 * | 11/2004 | Clement et al. | 341/155 |

FOREIGN PATENT DOCUMENTS

EP    0729234 B1    8/1996

OTHER PUBLICATIONS

"Understanding Flash ADCs," Dallas Semiconductor: Maxim, downloaded from <<http://www.maxim-ic.com/appnotes.cfm/appnote_number/810>> on Oct. 2, 2001, 6 pages.

(Continued)

*Primary Examiner*—Khai M. Nguyen

(57) ABSTRACT

Techniques for adjusting the dynamic range of an A/D converter in response to various conditions are disclosed. A value output by the A/D converter is utilized to determine if the A/D converter is operating at or above its current dynamic range capabilities (i.e., the A/D converter is potentially "saturated" at its current dynamic range setting). If potentially saturated, the dynamic range of the A/D converter may be increased. If not, the dynamic range of the A/D converter may be decreased or may be unchanged. Alternately, an upcoming or enacted change in the gain settings of one or more gain stages that condition the analog signal input to an A/D converter may be used as a condition that results in an adjustment to the dynamic range of the A/D converter.

20 Claims, 6 Drawing Sheets

OTHER PUBLICATIONS

"Demystifying Sigma-Delta ADCs," Dallas Semiconductor: Maxim, Application Note 1870: Jan. 31, 2003, downloaded from <<http://www.maxim-ic/an1870>>, 15 pages.

De Barros Soldera et al., "Implementing A 10-Bit Sigma-Delta Analog-to-Digital Converter Using the HC9S08Rx MCU Family Analog Comparator," Application Note AN2688/D: Mar. 2004, Freescale Semiconductor, Inc., 2004, 24 pages.

Park, "Motorola Digital Signal Processors: Principles of Sigma-Delta Modulation for Analog-to-Digital Converters," Motorola APR8/D, Rev. 1, 64 pages.

Terrovitis et al., "The Designers's Guide: Device Noise Simulation of Delta-Sigma Modulators," pp. 1-22, Apr. 2003, downloaded from <http://www.designers-guide.com>>, 22 pages.

"Flash ADC—Chapter 13: Digital-Analog Conversion," vol. IV—Digital, downloaded from <<http://www.allaboutcircuits.com/vol_4/chpt_13/4.html>> on Feb. 10, 2005, 4 pages.

"Delta-Sigma ADC—Chapter 13: Digital-Analog Conversion," vol. IV—Digital, downloaded from <<http://www.allaboutcircuits.com/vol_4/chpt_13/9.html>> on Feb. 10, 2005, 3 pages.

U.S. Appl. No. 11/098,154, filed Apr. 4, 2005, entitled "System and Method for Compensating for DC Offset in an Analog-to-Digital Converter,".

n

* cited by examiner

SYSTEM AND METHOD FOR ADJUSTING DYNAMIC RANGE OF ANALOG-TO-DIGITAL CONVERTER

CROSS-REFERENCE TO RELATED APPLICATIONS

The present application is related to U.S. patent application Ser. No. 11/098,154 (Client Reference No. SC14230ZC) filed Apr. 4, 2005 (presented abandoned).

FIELD OF THE DISCLOSURE

The present disclosure is related generally to analog-to-digital conversion and more specifically to adjusting the dynamic range of an analog-to-digital converter.

BACKGROUND

Analog-to-digital converters (A/D converters or ADCs) find common use in a wide variety of products that operate in both the analog and digital domains. To illustrate, wireless devices, such as cellular phones, laptop computers and personal digital assistants, typically use A/D converters to convert wireless analog signals that carry information into digital information suitable for processing and manipulation by microprocessors and other digital components.

While often critical to proper operation, A/D converters typically consume considerable power, a situation that is particularly relevant to devices that have a limited supply of power, such as battery-powered devices or portable devices. The power consumption of an A/D converter typically is related to the dynamic range of the A/D converter (i.e., the number of active output bits of the A/D converter). Accordingly, one common technique to reduce power consumption is to use an A/D converter with a limited dynamic range. However, in many applications, the implementation of an A/D converter having a limited dynamic range often requires additional front-end signal processing to condition the input signal for conversion by the limited dynamic-range A/D converter. For example, in radio frequency (RF) applications, the use of a limited dynamic-range A/D converter typically requires that increased selectivity be provided by the RF front end, thereby increasing the cost and complexity of the RF front end. Moreover, the power consumption of the additional circuitry required to implement the more complex RF front end typically offsets or even exceeds the power savings achieved by using a limited dynamic-range A/D converter.

Due to the additional cost and complexity of implementing limited dynamic-range A/D converters, another conventional technique has been developed whereby the dynamic range of an A/D converter is adjusted in response to a long-term averaging of the digital signal output by the A/D converter. This long-term averaging technique implements circuits to square, sum and filter the on-channel signal content at the back end of a RF transceiver, where the decision on whether to adjust the dynamic range of the A/D converter is made after considerable processing and delay. This technique requires considerable circuitry to implement the squaring, summing and filtering operations, which significantly increases the complexity of the RF application as well as its power consumption. Moreover, this technique is reliant on a significant amount of prior signal history due to the squaring, summing and filtering operations to average the signal at the back end and therefore introduces a significant delay between when a condition occurs and when this condition is identified and appropriate adjustment of the A/D converter is made, which may result in clipping and therefore requiring a change in the dynamic range of the A/D converter. Accordingly, an improved technique for adjusting the dynamic range of an A/D converter would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

FIGS. 1-7 illustrate exemplary techniques for adjusting the dynamic range of an A/D converter in response to various conditions. In at least one embodiment, a value output by the A/D converter is utilized to determine if the A/D converter is operating at or above its current dynamic range capabilities (i.e., the A/D converter is potentially "saturated" at its current dynamic range setting). If potentially saturated, the dynamic range of the A/D converter may be increased. If not, the dynamic range of the A/D converter may be decreased or may be unchanged. In another embodiment, an upcoming or enacted change in the gain settings of one or more gain stages that condition the analog signal input to an A/D converter may be used as a condition that results in an adjustment to the dynamic range of the A/D converter.

For purposes of illustration, the exemplary techniques disclosed herein are discussed in the context of a wireless transceiver for a third-generation (3G) cellular device, such as, for example, a Universal Mobile Telecommunications System (UMTS)-compliant radio frequency (RF) transceiver, or a Code Division Multiple Access (CDMA)-compliant RF transceiver. However, using the guidelines provided herein, those skilled in the art may utilize the disclosed techniques in any of a variety of systems implementing analog-to-digital signal conversion without departing from the spirit or the scope of the present disclosure.

Figure 1:
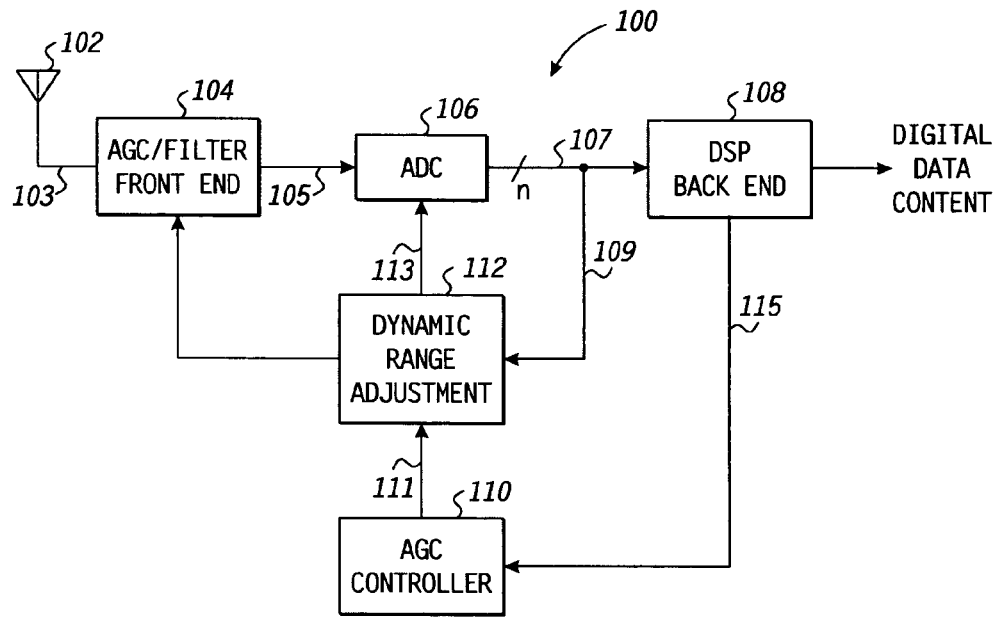
FIG. 1 is a block diagram illustrating an exemplary system utilizing an adjustable dynamic-range analog-to-digital (A/D) converter in accordance with at least one embodiment of the present disclosure.

Referring now to FIG. 1, an exemplary 3G RF transceiver 100 is illustrated in accordance with at least one embodiment of the present disclosure. The RF transceiver 100 includes an RF antenna 102, an automatic gain control (AGC)/filter front end 104, an adjustable dynamic-range analog-to-digital (A/D) converter (ADC) 106, a digital signal processing (DSP) back end 108, an AGC controller 110 and a dynamic range adjustment module 112.

In operation, the RF antenna 102 receives an RF signal 103 representative of one or more types of information, such as voice content, video content, audio content, data content and the like. The AGC/filter front end 104 conditions the RF signal 103 to generate an input signal 105. To condition the RF signal 103, the AGC/filter front end 104 typically implements one or more gain stages (e.g., amplifiers), mixers and filters, as disclosed in greater detail below with reference to FIG. 6. The gain settings of any gain stages implemented by the AGC/filter front end 104 may be controlled or otherwise set by the AGC controller 110.

The resulting conditioned signal 105 is provided to the A/D converter 106 for conversion to a digital format. In at least one embodiment, the A/D converter 106 samples (typically by oversampling) the conditioned signal 105 at substantially periodic sample points to generate a sequence of digital values 107 representative of the information supplied by conditioned signal 105. The output digital values 107 may be provided to the DSP back end 108 for further processing. The DSP back end 108 typically processes the digital values 107 by performing decimation filtering, channel filtering, DC offset calibration, format conversion, and the like. The resulting data then may be provided to the system utilizing the RF transceiver 100. To illustrate, the RF transceiver 100 may be implemented in a 3G cellular phone whereby the RF signal 103 represents voice, video and other data content transmitted to the 3G cellular phone for conversion to digital data for processing by the 3G cellular phone. Moreover, on-channel data resulting from channel filtering by the DSP back end 108 may be provided as on-channel information 115 to the AGC controller 110. In turn, the AGC controller 110 may perform one or more power detection techniques using the on-channel information 115 so as to determine appropriate gain settings for one or more gain stages of the front end 104.

In at least one embodiment, digital values 109 representative of at least a subset of the digital values 107 also are provided from the A/D converter 106 (e.g., before decimation filtering and channel filtering at the DSP back end 108) to the dynamic range adjustment module 112 as digital values 109. The digital values 109 may be the actual digital values 107 or they may represent the digital values 107 after further handling or processing by subsequent stages of the RF transceiver 100 (e.g., the output of latches having inputs coupled to the outputs of the A/D converter 106). The dynamic range adjustment module 112 may use some or all of the digital values 109 as each is received to determine whether a condition has been met and to adjust the dynamic range of the A/D converter 106 accordingly. The dynamic range adjustment module 112 further may use information 111 related to the upcoming (e.g., predicted) or enacted gain settings of the AGC controller 110 and the gain stages of the AGC/front end 104 to determine whether one or more conditions has been met and a change to the dynamic range of the A/D converter 106 should be made in response.

The conditions considered by the dynamic range adjustment module 112 in adjusting the dynamic range of the A/D converter 106 may include, for example, whether the A/D converter 106 is potentially saturated as a result of the current dynamic range set for the A/D converter 106 and the current characteristics (e.g., amplitude) of the conditioned signal 105 (which correspond to the characteristics of the RF signal 103) or whether the A/D converter 106 will have the potential to be saturated as a result of an enacted or upcoming change in the gain settings of one or more gain stages of the front end 104. In one embodiment, the dynamic range adjustment module 112 may identify a potential saturation condition of the A/D converter 106 by comparing the most recent sampled digital value 109 with the maximum value that the A/D converter 106 is able to output under the current dynamic range setting. This comparison may be employed using, for example, a comparator. In the event that the most recent sampled digital value 109 is equal to this maximum value or is within a predetermined tolerance, the dynamic range adjustment module 112 may determine that the A/D converter 106 is potentially saturated and increase its dynamic range accordingly.

To illustrate, if the dynamic range of the A/D converter 106 is presently set to six (6) bits, the maximum value that the A/D converter 106 may correctly output generally is $00111111_b$. Thus, if the most recent sampled digital value 109 is $00111111_b$ (i.e., equal to the maximum value in this example), the A/D converter 106 potentially is saturated and therefore may have its dynamic range increased to allow its maximum represented value to increase. Using the same example above, if the most recent digital value 109 is $00111110_b$, the dynamic range adjustment module 112 may determine that the A/D converter 106 is potentially saturated and therefore increase its dynamic range if the most recent sampled digital value 109 is within a predetermined range of, for example, one (1). In contrast, if the most recent sampled digital value 109 is $00111101_b$ and the predetermined threshold is one (1) as in the previous example, the dynamic range adjustment module 112 may determine that there is no potential saturation condition for the A/D converter 106 as the most recent sampled digital value 109 is less than the maximum value of the A/D converter 106 by more than the predetermined threshold.

The dynamic range adjustment module 112 may use the gain control setting information 111 in addition to, or instead of, the most recent sampled digital value 109 to determine whether a potential saturation condition of the A/D converter 106 exits. It will be appreciated that an increase in the gain settings of the amplifier(s) of the AGC/filter front end 104 typically results in an increase in the amplitude of the signal 105. The increased amplitude of the signal 105 has the potential to saturate the A/D converter 106 depending on its dynamic range set when the signal 105 is received. Accordingly, in at least one embodiment, the AGC controller 110 provides gain information 111 to the dynamic range adjustment module 112 in response to an indication that the change in the gain setting is upcoming or is already enacted. The gain information 111 may include, for example, a representation of the amount of the gain change (i.e., the magnitude of the gain change) and the direction of the gain change (i.e., the "sign" of the gain change).

In response to determining that the dynamic range of the A/D converter 106 has been adjusted or is to be adjusted, the dynamic range adjustment module 112 provides adjustment information 113 to the A/D converter 106, wherein the A/D converter 106 adjusts its dynamic range consistent with the adjustment information 113. As discussed below in greater detail with reference to FIGS. 6 and 7, the A/D converter 106, in one embodiment, includes a flash A/D converter (also commonly known as a parallel A/D converter) having, for example, $2^n-1$ or $2^n$ comparators for an n-bit output, where some or all of the comparators may be enabled or disabled to increase or decrease the dynamic range of the A/D converter 106 (and thereby increasing or decreasing the power consumption). In this instance, the adjustment information 113 may include a representation of which comparators of the flash A/D converter are to be enabled, or conversely, a representation of which comparators are to be disabled. The A/D converter 106 then may enable or disable the indicated comparators based on this representation.

Figure 2:
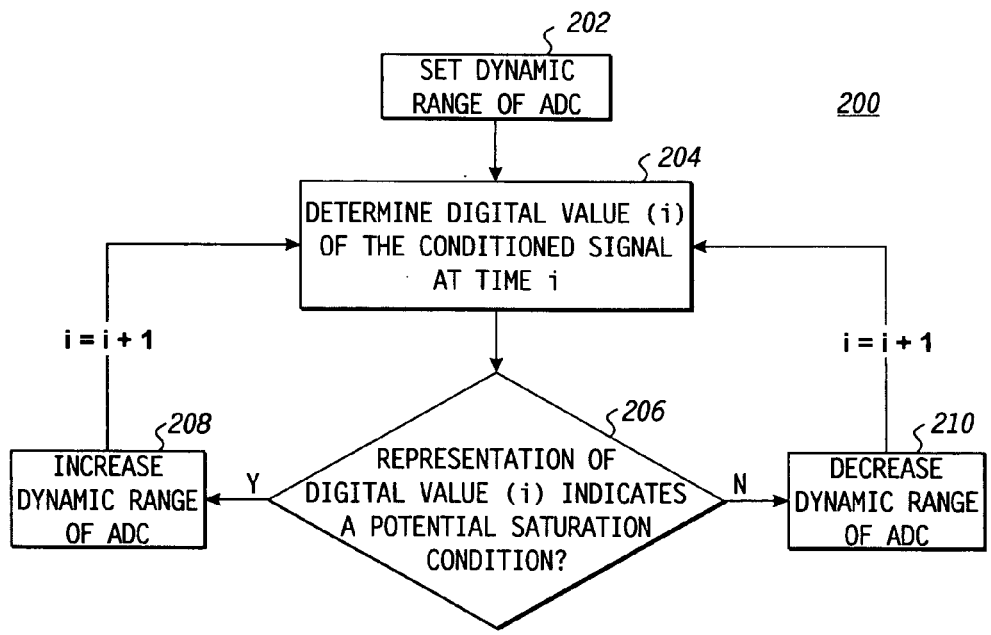
FIGS. 2-4 are flow diagrams illustrating exemplary methods for adjusting a dynamic range of an A/D converter in accordance with at least one embodiment of the present disclosure.

Referring now to FIG. 2, an exemplary method 200 for dynamically adjusting the dynamic range of the A/D converter 106 of FIG. 1 is illustrated in accordance with at least one embodiment of the present disclosure. Method 200 initiates at step 202 wherein the dynamic range of the A/D converter 106 is set for the upcoming sample period. At step 204 the conditioned signal 105 is converted to a digital value (digital_value(i)) by the A/D converter 106 at sample time i using the dynamic range set at step 202. A representation of the sampled digital value is provided to the dynamic range adjustment module 112. The representation may be the actual sampled digital value or may be another value representing the sampled digital value (e.g., such as the output of one or more latches having inputs to receive a corresponding bit of the sampled digital value). At step 206 the module 112 determines whether a potential saturation condition exits based on the representation of the sampled digital value. In one embodiment, the module 112 determines whether a potential saturation condition exits based on a comparison of the representation of the sampled digital value to the maximum value (max val(i)) the A/D converter 106 is capable of correctly outputting based on its current dynamic range. If the representation of the sampled digital value is equal to or within a predetermined threshold (PT) of the maximum value (e.g., digital_value(i)>=max_val(i)–PT, PT=0 . . . x), the module 112 may identify the A/D converter 106 as potentially saturated. If so identified, at step 208 the module 112 may direct or instruct the A/D converter 106 to increase its dynamic range by, for example, enabling more comparators if the A/D converter 106 implements a flash A/D. The degree by which the dynamic range is increased at step 208 may be fixed or vary based on certain circumstances, such as the number of comparators already enabled or how close the sampled digital value is to the maximum value. In embodiments utilizing a flash A/D converter, increases in the number of enabled comparators, and therefore increases in the dynamic range of the A/D converter 106, may be made as powers of two as the number of enabled comparators may be represented by a binary number.

If no potential saturation condition is identified as existing, in one embodiment, the dynamic range of the A/D converter 106 is reduced at step 210 (in other embodiments, the dynamic range of the A/D converter 106 may remain unchanged at step 210). As with increases in the dynamic range, the degree by which the dynamic range is decreased may be fixed or based on certain characteristics. In instances wherein a flash A/D converter is used, the dynamic range may be reduced by half if the number of enabled comparators is represented by a binary number. The method 300 then repeats for the next sample period i+1.

The above-described method 200 provides for rapid adjustments to the dynamic range of the A/D converter 106 so as to reduce the power consumed by the A/D converter 106 without significantly impairing the accurate digital reproduction of the information represented by an analog signal. By adjusting the dynamic range by analyzing sampled digital values output by the A/D converter 106 (or representations thereof) to identify potential saturation conditions and potential non-saturation conditions, the dynamic range of the A/D converter 106 may be rapidly tuned to a more-optimal setting for each sample period so as to provide the appropriate resolution while allowing for a reduction in the power consumption of the A/D converter 106 when appropriate.

Figure 3:
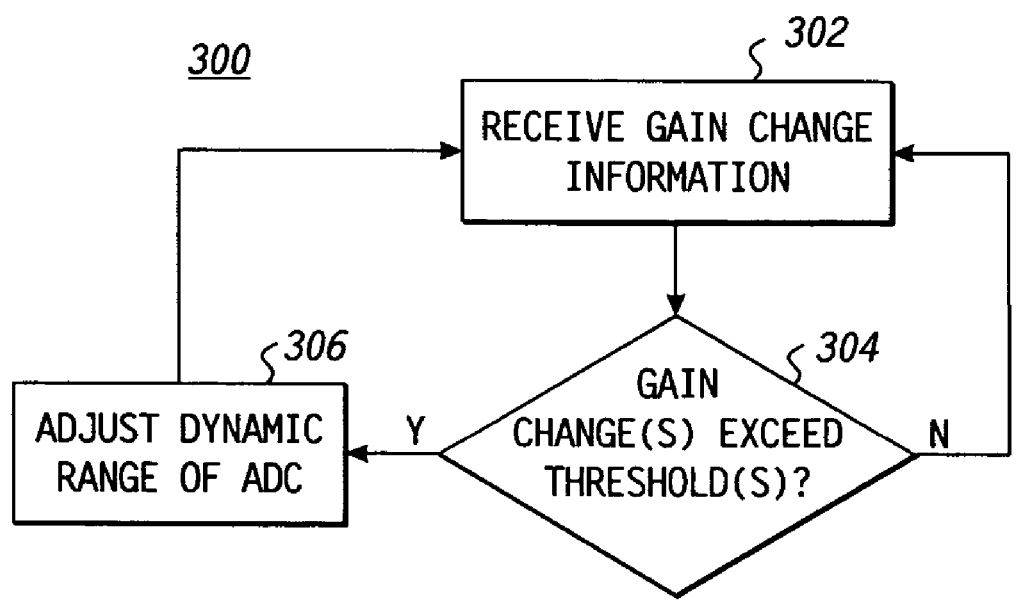

Referring now to FIG. 3, an exemplary method 300 for adjusting the dynamic range of the A/D converter 106 in response to an upcoming change or enacted change in the gain settings is illustrated in accordance with at least one embodiment of the present disclosure. The method 300 initiates at step 302 wherein the dynamic range adjustment module 112 receives gain change information 111 from the AGC controller 110. As noted above, the gain change information 111 may be provided in anticipation of an upcoming gain settings change or in response to an enacted gain setting change. The gain change information 111 may include, for example, an indication of the magnitude of the gain change and an indication of the direction of the gain change (i.e., increased or decreased gain).

At step 304, the module 112 compares the gain change information 111 with one or more thresholds to determine whether a threshold is exceeded. For example, an upper threshold may be used to set the maximum increase in gain before an increase in the dynamic range of the A/D converter 106 is appropriate and a lower threshold may be used to set the maximum decrease in gain before a decrease in the dynamic range of the A/D converter 106 is appropriate. The one or more thresholds may be fixed (e.g., set at a fixed gain change magnitude) or may be set relative to the current gain setting (e.g., set as a proportion of the current gain setting).

If the module 112 determines that a threshold is exceeded, at step 306 the module 112 provides adjustment information 113 to the A/D converter 106 to adjust its dynamic range accordingly. If a threshold associated with a positive gain change is exceeded, the module 112 directs the A/D converter 106 to increase its dynamic range to accommodate the increased gain provided or to be provided by the gain stages of the AGC/filter front end 104. If a threshold associated with a negative gain change is exceeded, the module 112 directs the A/D converter 106 to decrease its dynamic range to take advantage of the reduced gain provided or to be provided by the gain stages so as to reduce the power of the A/D converter 106.

Figure 4:
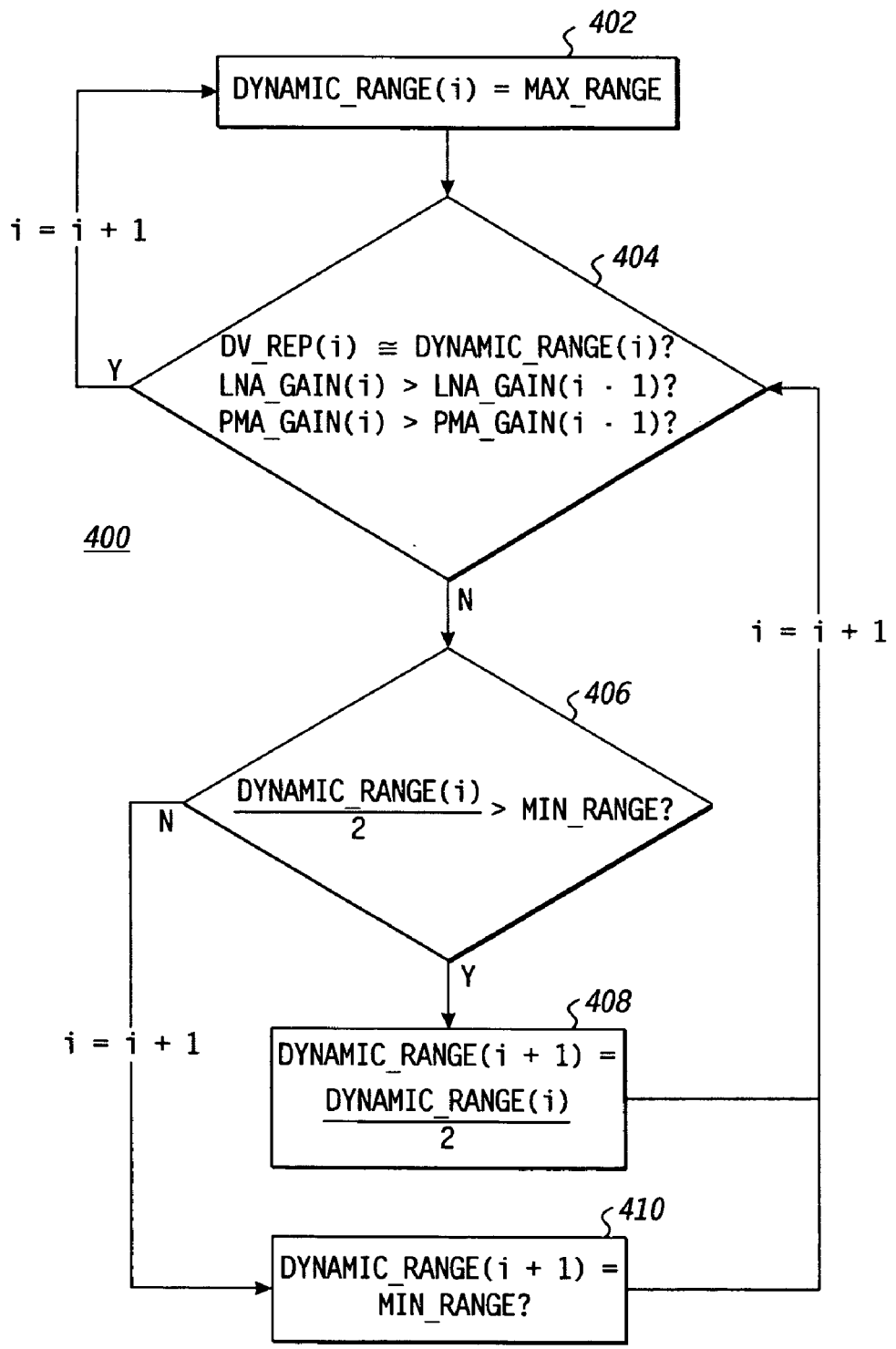

Referring now to FIG. 4, an exemplary method 400 for adjusting the dynamic range of the A/D converter 106 based on both the output of the A/D converter 106 and on gain change information 111 is illustrated in accordance with at least one embodiment of the present disclosure. The method 400 initiates at step 402 wherein the dynamic range for the present sample period i is set to a maximum dynamic range (max_dynamic_range) of the A/D converter 106.

At step 404 the dynamic range adjustment module 112 determines whether any of a variety of conditions exist. In the illustrated example, one possible condition includes a potential saturation condition, i.e., the representation of the digital value sampled during sample period i (DV_Rep(i)) is equal to or within a predetermined tolerance of the dynamic range (dynamic_range(i)) of the A/D converter 106 during the sample period i. Another possible condition may include that the gain setting for an low-noise amplifier (LNA)(not shown) of the AGC/filter front end 104 is greater than its gain setting for the previous sample period i–1. A third possible condition may include that the gain setting for a post-mixer amplifier (PMA)(not shown) of the AGC/filter front end 104 is greater than its gain setting for the previous sample period i–1. In the event that the module 112 determines that any of these conditions exist, the method 400 returns to step 402 wherein the dynamic range of the A/D converter 106 for the next sample period i+1 is set to the maximum dynamic range.

If at least one of the conditions are met at step 404, the method 400 continues to step 406 wherein the module 112 determines whether the current dynamic range of the A/D converter 106 is greater than twice the minimum dynamic range (min_range) allowed for the A/D converter 106. If so, the dynamic range for the A/D converter 106 for the next sample period i+1 is decreased to half of the dynamic range for the current sample period i at step 408. If not, the dynamic range for the A/D converter 106 for the next sample period i+1 is set to the minimum dynamic range at step 410. The method 400 then may be repeated for the next sample period i=i+1.

Figure 5:
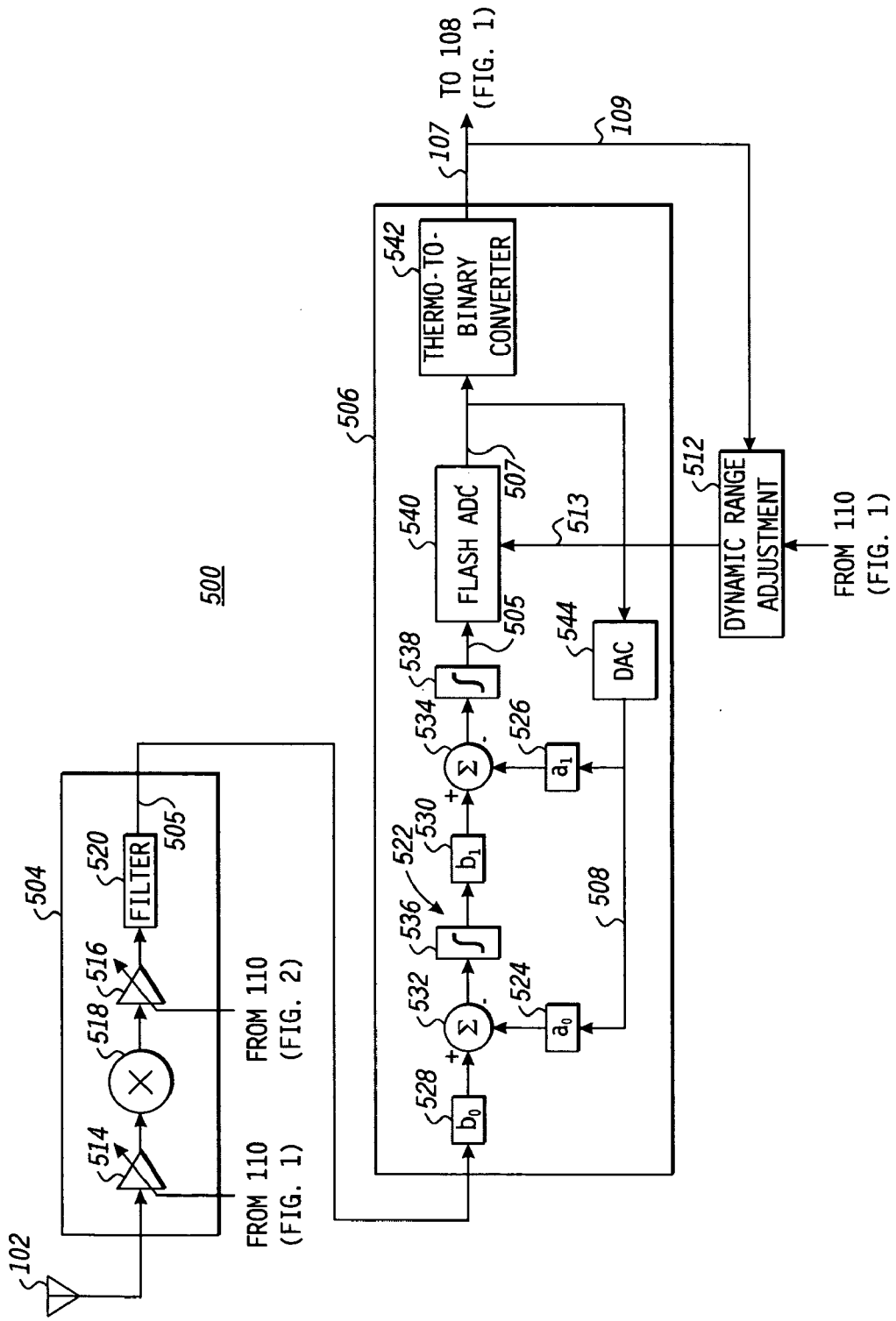
FIG. 5 is a block diagram illustrating an exemplary implementation of the system of FIG. 1 in accordance with at least one embodiment of the present disclosure.

Referring now to FIG. 5, an exemplary implementation of the RF transceiver 100 of FIG. 1 is illustrated in accordance to at least one embodiment of the present disclosure. The RF transceiver 500 includes the RF antenna 102, an AGC/filter front end 504 (analogous to the AGC/filter front end 104 of FIG. 1), an A/D converter 506 (analogous to the A/D converter 106 of FIG. 1) and a dynamic range adjustment module 512 (analogous to the module 112 of FIG. 1).

In the illustrated example, the AGC/filter front end 504 includes an LNA 514, a mixer 518, a PMA 516 and one or more analog filters 520. The gain settings of the LNA 514 and the PMA 516 may be set by the AGC controller 110 (FIG. 1). The A/D converter 506 includes a sigma-delta integration module 522, a flash ADC 540, an n-bit digital-to-analog converter (DAC) 544 and a thermo-to-binary converter 542. The sigma-delta integration module 522 includes resists 524-530, summers 532 and 534 and integrators 536 and 538 connected as illustrated in FIG. 5.

In operation, the RF signal received at the antenna 102 is amplified by amplifiers 514 and 516 and filtered by filter(s) 520 to generate a conditioned signal 505. The conditioned signal 505 is provided to the sigma-delta integration module 522, which is exemplary illustrated as a second-order sigma-delta integration module 522. However, higher or lower-order sigma-delta architectures may be implemented using the guidelines provided herein without departing from the spirit or the scope of the present disclosure. The resulting signal 506 is provided to the flash ADC 540, whereupon quantized digital values 507 having, for example, $2^n$ or $2^n-1$ bits representative of the conditioned signal 505 are output by the flash ADC 540 at sample times i=0 ... n. The digital values 507 are also provided to the DAC 544, which converts the digital values 507 to an analog signal 508 used for feedback in the sigma-delta module 522.

The thermo-to-binary converter 542 converts or encodes the digital values 507 to digital values 107 which then may be provided to the DSP back end 108 (FIG. 1) for further processing. Digital values 109 that are representations of one or more of the digital values 107 are provided to the dynamic range adjustment module 512. As discussed above, the module 512 may use the most recent digital value 109 and/or the gain setting information 111 to determine whether one or more conditions exist whereby an adjustment to the dynamic range of the flash ADC 540 would be appropriate. Should an adjustment be appropriate, the module 512 may provide adjustment information 513 representative of the adjustment to the flash ADC 540. In one embodiment, the adjustment information 513 includes a representation of which comparators of the flash ADC 540 are to be enabled, or, conversely, which comparators are to be disabled. Although FIG. 5 illustrates that the module 512 initiates adjustments to the flash ADC 540 based on the digital values 109 output from the converter 542, it will be appreciated that the module 512 instead may utilize output 507 of the flash ADC 540 to determine and enact the appropriate changes to the flash ADC 540 without departing from the scope of the present disclosure.

Figure 6:
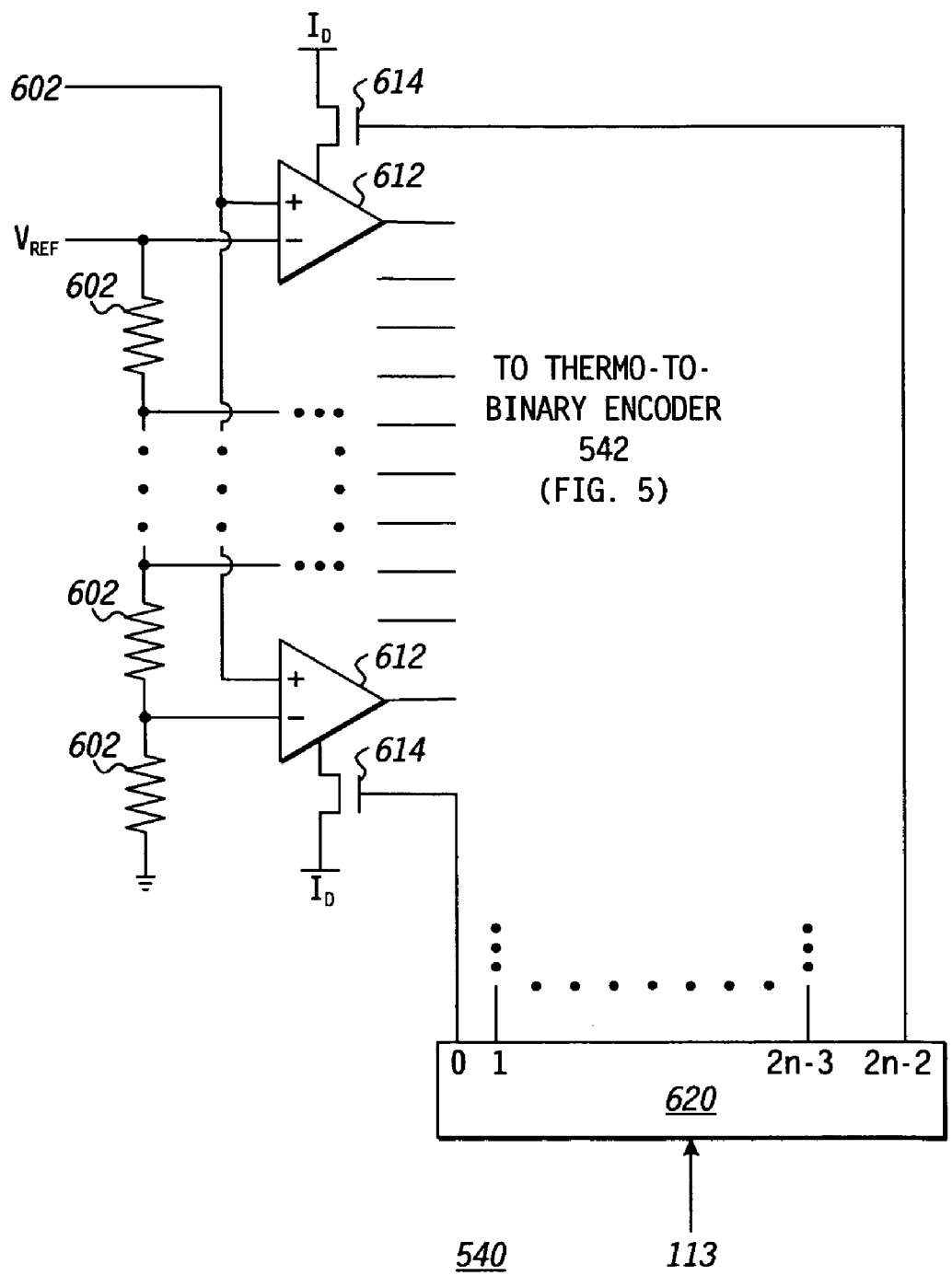
FIG. 6 is a block diagram illustrating an exemplary adjustable dynamic-range A/D converter in accordance with at least one embodiment of the present disclosure.

Referring now to FIG. 6, an exemplary implementation of the flash ADC 540 is illustrated in accordance with at least one embodiment of the present disclosure. In the depicted example, the flash ADC 540 includes a resistor chain comprising $2^n-1$ resistors 602 in series between a first voltage reference $V_{ref}$ and a second voltage reference (typically ground). The flash ADC 540 further includes $2^n-1$ comparators 612, each comparator 612 having an input to receive the conditioned signal 506 (FIG. 5) and an input to receive the voltage on the resistor chain at the corresponding stage. The outputs of the comparators 612 are provided for to the converter 542 (FIG. 5) for encoding. The outputs of the comparators 612 indicate the relationship between the voltages at their inputs. Each comparator 612 is supplied power from a voltage reference $V_D$.

In one embodiment, the comparators 612 may be enabled or disabled by engaging or disengaging switches 614 (illustrated as transistors) between the voltage $V_D$ and each comparator 612 so as to supply power or cut off power, respectively, to the comparators 612. By adjusting which comparators 612 receive power, the dynamic range and the power consumption of the flash ADC 540, and thus the dynamic range and power consumption of the A/D converter 506, may be adjusted accordingly.

In one embodiment, the switches 614 are controlled by a decoder 620 having an input to receive the adjustment information 113 and $2^n-1$ outputs, each connected to the switch 614 of a corresponding comparator 612. The decoder 620 may receive a value received as information 113 that represents which comparators are to be enabled and enable the corresponding outputs. For example, if the flash ADC 540 implemented eight comparators 612, the decoder 620 could receive a three-bit number corresponding to comparators 612 to enable and enable the corresponding number of outputs (e.g., output pin values, left to right, of 00111110 for an input value of $101_b$). Alternatively, the value received by the decoder 620 may represent which comparators 612 to disable, in response to which the decoder 620 may disable the corresponding outputs to disable the corresponding comparators 612.

Figure 7:
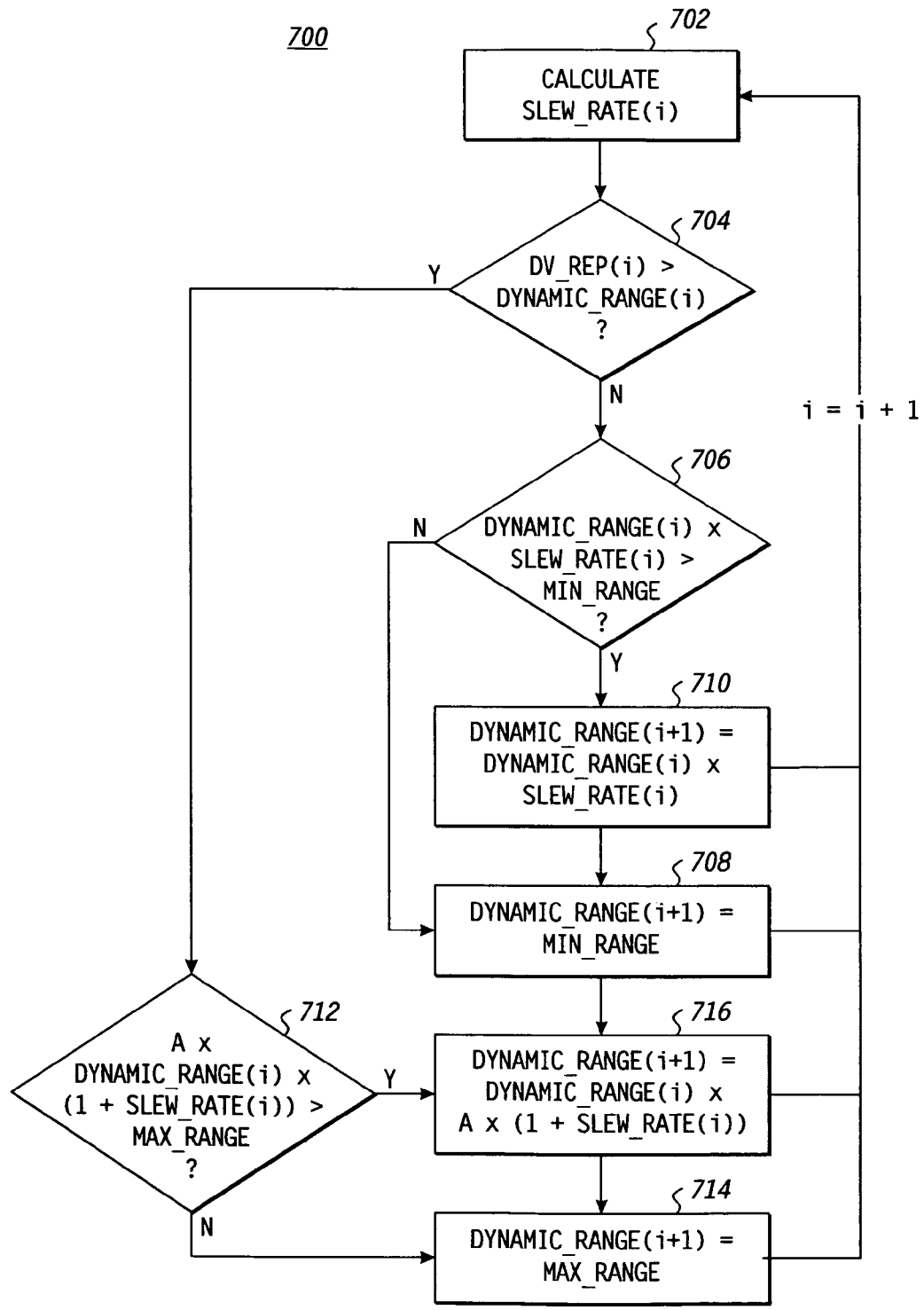
FIG. 7 is a flow diagram illustrating an exemplary method for adjusting the dynamic range of an A/D converter based on a slew rate in accordance with at least one embodiment of the present disclosure.

Referring now to FIG. 7, an exemplary method 700 for adjusting the dynamic range of the A/D converter 106 based on the rate of change (e.g., the "slew rate") of the digital values 107 output by the A/D converter 106. The method 700 initiates at step 702 wherein the signal slew rate is calculated for sample time i by calculating a moving average of the normalized magnitude of the sample values 107 output by the A/D converter 106 over the last $2^m$ samples. This calculation may be computed by using an IIR filter equation:

$$H(z)=(1/M) \times (1-z^{-M})/(1-z^{-1}) \qquad \text{Eq. 1}$$

where H(z) represents the calculated slew rate, z represents the value 107 sampled at time i, and M represents $2^m$. A power integrator and differentiator circuit may be used to implement this equation in hardware. Alternatively, the slew rate could be calculated as a difference (e.g., a delta value) between the current value and one or more previous values.

At step 704, the value 107 sampled at time i (DV_Rep(i)) is compared to the current dynamic range (Dynamic_Range (i)) to determine whether the A/D converter 106 is potentially saturated. If not, the method 700 continues to step 706, wherein the current dynamic range scaled by the current slew rate (i.e., Dynamic_Range(i)×slew_rate(i)) is compared with a predetermined minimum dynamic range (Min_Range) allowed for the A/D converter 106. If the scaled dynamic range is less than or equal to the minimum dynamic range, then the dynamic range of the A/D converter 106 for the next sample period is set to the minimum dynamic range (i.e., Dynamic_Range(i+1)=Min_Range) at step 708. Otherwise, the dynamic range of the A/D converter 106 for the next sample period is set to the scaled dynamic range (i.e., Dynamic_Range(i+1)=Dynamic_Range(i)×slew_rate(i)) at step 710.

If a potential saturation condition is indicated at step 704, the method 700 continues to step 712 wherein the current dynamic range scaled by a constant A and the slew rate (e.g., Dynamic_Range(i)×A×(1+slew_rate(i))) is compared with the maximum allowed dynamic range (Max_Range) of the A/D converter 106. If the scaled current dynamic range is less than or equal to the maximum dynamic range, the dynamic range of the A/D converter 106 for the next sample period is set to the maximum dynamic range (i.e., Dynamic_Range(i+1)=Max_Range) at step 714. Otherwise, the dynamic range of the A/D converter 106 for the next sample period is set to the scaled current dynamic range (i.e., Dynamic_Range(i+1)=Dynamic_Range(i)×A×(1+slew_rate(i))) at step 716. The method 700 then may be repeated for the next sample period i=i+1.

In accordance with one aspect of the present disclosure, a method is provided. The method comprises determining a first value of a modulated analog signal at an analog-to-digital converter (ADC) at a first sample time, wherein the ADC comprises a first dynamic range at the first sample time and adjusting a dynamic range of the ADC to have a second dynamic range when a second value meets a first condition, wherein the second value is a representation of the first value. The second value and the first value may be the same value. The method further may comprise determining a third value of a modulated analog signal at the ADC at a second sample time, wherein the ADC comprises the second dynamic range at the second sample time and the second sample time is adjacent the first sample time. In another aspect, determining the first value comprises determining the first value at an ADC having M comparators and wherein the first value is represented by N bits, where N is less than M and adjusting the dynamic range includes enabling a different number of the M comparators than are enabled at the first sample time. Adjusting the dynamic range may comprise enabling a greater number of the M comparators and the first condition is met when the second value exceeds a first dynamic range of the ADC.

The method also may comprise adjusting a dynamic range of the ADC to have a third dynamic range when the second value meets a second condition. In one aspect, adjusting the dynamic range of the ADC to have the third dynamic range includes enabling a smaller number of the M comparators and the first condition is met when the second value is within a second dynamic range of the ADC. Adjusting the dynamic range of the ADC to have the third dynamic range may comprise enabling a greater number of the M comparators and the first condition is met when a gain of a variable gain stage is scheduled to be increased, wherein the analog modulated signal is based upon the variable gain stage. Adjusting the dynamic range also may comprise enabling a smaller number of the M comparators and the first condition is met when the second value is within a first dynamic range of the ADC.

In accordance with another aspect of the present disclosure, a method is provided, the method including receiving a first signal at an analog-to-digital converter (ADC), wherein the first signal is based upon a second signal that has been adjusted by a first gain stage set to a first gain value and the ADC comprises a first dynamic range and adjusting the dynamic range of the ADC to have a second dynamic range in response to a change in the first gain stage to a second gain value. The change in the first gain stage is one of an upcoming change or an enacted change. In one aspect, the second dynamic range is greater than the first dynamic range when the second gain value is greater than the first gain value and the second dynamic range is less than the first dynamic range when the second gain value is less than the first gain value.

In accordance with yet another aspect of the present disclosure, a system is provided. The system comprises an analog-to-digital converter (ADC) comprising an input to receive an analog signal, an output to provide a digital representation of the analog signal, and a plurality of comparators coupled between the input and the output, each comparator of the plurality of comparators comprising a corresponding enable input to enable its operation when asserted and a module comprising an input coupled to the output of the ADC and an output to provide one or more enable signals to indicate which of the plurality of comparators are to be enabled based upon a value at the input. In one aspect, the module is operable to provide a first enable signal indicating a first number of comparators to be enabled when the value indicates a first condition has been met and provide a second enable signal indicating a second number of comparators to be enabled when the value indicates a second condition has been met. The first condition may represent a potential saturation of the ADC, the second condition may represent a non-saturation of the ADC and the first number of comparators may be greater than the second number of comparators. In one aspect, the system further comprises a gain stage having an output operably coupled to the first input of the ADC and wherein the module is further operable to provide one or more enable signals to indicate which of the plurality of comparators are to be enabled based on a change.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
   determining a first value of a modulated analog signal at an analog-to-digital converter (ADC) at a first sample time, wherein the ADC comprises a first dynamic range at the first sample time;
   adjusting a dynamic range of the ADC to have a second dynamic range when a second value meets a first condition, wherein the second value is a representation of the first value and wherein the first condition represents a potential saturation of the first dynamic range of the ADC; and
   adjusting the dynamic range of the ADC to have a third dynamic range when a gain setting of a gain stage having an output operably coupled to an input of the ADC is expected to meet a second condition.

2. The method of claim 1, wherein the second value and the first value are the same value.

3. The method of claim 1, further comprising:
determining a third value of the modulated analog signal at the ADC at a second sample time; wherein the ADC comprises the second dynamic range at the second sample time and the second sample time is adjacent the first sample time.

4. The method of claim 1, wherein:
determining the first value comprises determining the first value at an ADC having M comparators and wherein the first value is represented by N bits, where N is less than M; and
adjusting the dynamic range includes enabling a different number of the M comparators than are enabled at the first sample time.

5. The method of claim 4, wherein adjusting the dynamic range includes enabling a greater number of the M comparators and the first condition is met when the second value exceeds the first dynamic range of the ADC.

6. The method of claim 5, further comprising:
adjusting a dynamic range of the ADC to have a fourth dynamic range when the second value meets a third condition.

7. The method of claim 6, wherein adjusting the dynamic range of the ADC to have the fourth dynamic range includes enabling a smaller number of the M comparators and the first condition is met when the second value is within the second dynamic range of the ADC.

8. The method of claim 4, wherein adjusting the dynamic range includes enabling a smaller number of the M comparators and the first condition is met when the second value is within a first dynamic range of the ADC.

9. The method of claim 1, wherein adjusting the dynamic range comprises adjusting the dynamic range based on a slew rate of one or more previous values of the modulated signal at the ADC.

10. A system comprising:
an analog-to-digital converter (ADC) comprising an input to receive an analog signal, an output to provide a digital representation of the analog signal, and a plurality of comparators coupled between the input and the output, each comparator of the plurality of comparators comprising a corresponding enable input to enable its operation when asserted;
a gain stage having an output operably coupled to the input of the ADC; and
a module comprising an input coupled to the output of the ADC and an output to provide one or more enable signals to indicate which of the plurality of comparators are to be enabled in response to a change in a gain setting of the gain stage.

11. The system of claim 10, wherein the module is operable to:
provide a first enable signal indicating a first number of comparators to be enabled when the change in the gain setting indicates a first condition has been met; and
provide a second enable signal indicating a second number of comparators to be enabled when the change in the gain setting indicates a second condition has been met.

12. The system of claim 11, wherein:
the first condition represents a potential saturation of the ADC;
the second condition represents a non-saturation of the ADC; and
the first number of comparators is greater than the second number of comparators.

13. The system of claim 10, wherein the ADC comprises a sigma-delta ADC.

14. The system of claim 10, wherein the change in the gain setting comprises an upcoming change.

15. The system of claim 10, wherein the change in the gain setting comprises an enacted change.

16. A method comprising:
determining a first value of a modulated analog signal at an analog-to-digital converter (ADC) at a first sample time, wherein the ADC comprises a first dynamic range at the first sample time;
adjusting a dynamic range of the ADC to have a second dynamic range based on a slew rate of one or more previous values of the modulated analog signal at the ADC when a second value meets a first condition, wherein the second value is a representation of the first value; and
adjusting the dynamic range of the ADC to have a third dynamic range when a gain setting of a gain stage having an output operably coupled to an input of the ADC is expected to meet a second condition.

17. The method of claim 16, wherein the second value and the first value are the same value.

18. The method of claim 17, wherein:
determining the first value comprises determining the first value at an ADC having M comparators and wherein the first value is represented by N bits, where N is less than M; and
adjusting the dynamic range includes enabling a different number of the M comparators than are enabled at the first sample time.

19. The method of claim 18, wherein adjusting the dynamic range includes enabling a greater number of the M comparators and the first condition is met when the second value exceeds the first dynamic range of the ADC.

20. The method of claim 16, further comprising:
determining a third value of the modulated analog signal at the ADC at a second sample time; wherein the ADC comprises the second dynamic range at the second sample time and the second sample time is adjacent the first sample time.

* * * * *